(12) United States Patent
Qian et al.

(10) Patent No.: US 12,037,239 B2
(45) Date of Patent: Jul. 16, 2024

(54) METHOD FOR PRODUCING MONOLITHIC INTEGRATION OF PIEZOELECTRIC MICROMACHINED ULTRASONIC TRANSDUCERS AND CMOS

(71) Applicant: VANGUARD INTERNATIONAL SEMICONDUCTOR SINGAPORE PTE. LTD., Singapore (SG)

(72) Inventors: You Qian, Singapore (SG); Humberto Campanella-Pineda, Singapore (SG); Rakesh Kumar, Singapore (SG)

(73) Assignee: VANGUARD INTERNATIONAL SEMICONDUCTOR SINGAPORE PTE. LTD., Singapore (SG)

(*) Notice: Subject to any disclaimer, the term of this patent is extended or adjusted under 35 U.S.C. 154(b) by 637 days.

(21) Appl. No.: 17/206,116

(22) Filed: Mar. 18, 2021

(65) Prior Publication Data

US 2021/0206630 A1    Jul. 8, 2021

Related U.S. Application Data

(62) Division of application No. 15/840,881, filed on Dec. 13, 2017, now Pat. No. 10,988,376.

(51) Int. Cl.
*B81C 1/00* (2006.01)
*B06B 1/06* (2006.01)
(Continued)

(52) U.S. Cl.
CPC ............ *B81C 1/00246* (2013.01); *B06B 1/06* (2013.01); *B81B 3/0021* (2013.01); *H10N 30/06* (2023.02);
(Continued)

(58) Field of Classification Search
CPC ........ B81C 1/00246; B81C 2201/0105; B81C 2203/0735; B81C 2203/0771;
(Continued)

(56) References Cited

U.S. PATENT DOCUMENTS 9,646,874 B1    5/2017  Wojciechowski
10,497,747 B2 * 12/2019  Tsai ........................ H10N 30/07
(Continued)

*Primary Examiner* — Jeffrey T Carley
*Assistant Examiner* — Jose K Abraham
(74) *Attorney, Agent, or Firm* — Winston Hsu

(57) ABSTRACT

A method of forming a monolithic integrated PMUT and CMOS with a coplanar elastic, sealing, and passivation layer in a single step without bonding and the resulting device are provided. Embodiments include providing a CMOS wafer with a metal layer; forming a dielectric over the CMOS; forming a sacrificial structure in a portion of the dielectric; forming a bottom electrode; forming a piezoelectric layer over the CMOS; forming a top electrode over portions of the bottom electrode and piezoelectric layer; forming a via through the top electrode down to the bottom electrode and a second via down to the metal layer through the top electrode; forming a second metal layer over and along sidewalls of the first and second via; removing the sacrificial structure, an open cavity formed; and forming a dielectric layer over a portion of the CMOS, the open cavity sealed and an elastic layer and passivation formed.

10 Claims, 14 Drawing Sheets

(51) Int. Cl.
  *B81B 3/00* (2006.01)
  *H10N 30/06* (2023.01)
  *H10N 30/074* (2023.01)
  *H10N 30/093* (2023.01)
  *H10N 30/87* (2023.01)
  *H10N 39/00* (2023.01)
  *H10N 30/853* (2023.01)
  *H10N 30/88* (2023.01)

(52) U.S. Cl.
  CPC ......... *H10N 30/074* (2023.02); *H10N 30/875* (2023.02); *H10N 39/00* (2023.02); *B81B 2201/0271* (2013.01); *B81B 2201/032* (2013.01); *B81B 2207/015* (2013.01); *B81B 2207/096* (2013.01); *B81B 2207/115* (2013.01); *B81C 2201/0105* (2013.01); *B81C 2203/0735* (2013.01); *B81C 2203/0771* (2013.01); *H10N 30/093* (2023.02); *H10N 30/853* (2023.02); *H10N 30/883* (2023.02)

(58) Field of Classification Search
  CPC .......... B81B 3/0021; B81B 2201/0271; B81B 2207/015; B81B 2207/096; B81B 2207/115; H10N 30/06; H10N 30/074; H10N 30/875; H10N 39/00; H10N 30/093
  See application file for complete search history.

(56) References Cited

U.S. PATENT DOCUMENTS

| | | |
|---|---|---|
| 2010/0314668 A1 | 12/2010 | Ollier |
| 2011/0057288 A1 | 3/2011 | Tan |
| 2012/0319174 A1 | 12/2012 | Wang |
| 2014/0145275 A1* | 5/2014 | Hong .................... B06B 1/0292 257/416 |
| 2014/0162392 A1 | 6/2014 | Ollier |
| 2014/0264475 A1* | 9/2014 | Lin ...................... B81C 1/00333 257/254 |
| 2015/0210540 A1 | 7/2015 | Sadaka |
| 2015/0357375 A1* | 12/2015 | Tsai .................... H10N 30/302 257/416 |
| 2016/0090300 A1* | 3/2016 | Tsai .................... B81C 1/00246 257/254 |
| 2016/0122182 A1* | 5/2016 | Cheng .................... H10B 10/12 438/53 |
| 2016/0236932 A1 | 8/2016 | Chau |
| 2017/0158494 A1* | 6/2017 | Cheng ............... H01L 21/02178 |
| 2017/0245035 A1 | 8/2017 | Lee |
| 2017/0275158 A1* | 9/2017 | Shin ........................ H10N 30/30 |
| 2017/0301853 A1* | 10/2017 | Xia ........................ H10N 30/05 |
| 2018/0029882 A1* | 2/2018 | Cheng ................ B81C 1/00238 |
| 2020/0111834 A1* | 4/2020 | Tsai .................... B81C 1/00246 |

* cited by examiner

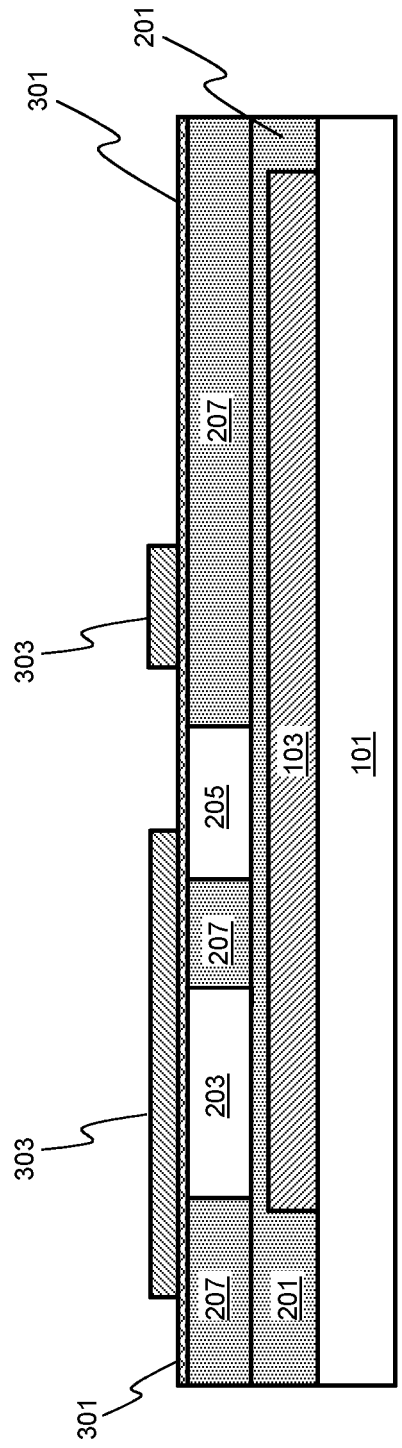
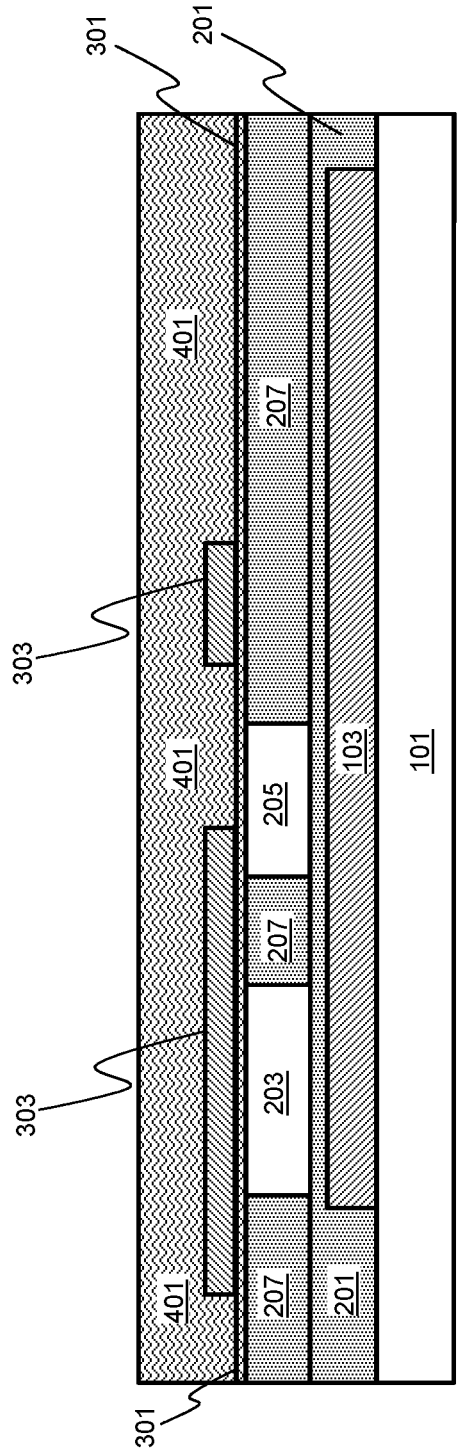

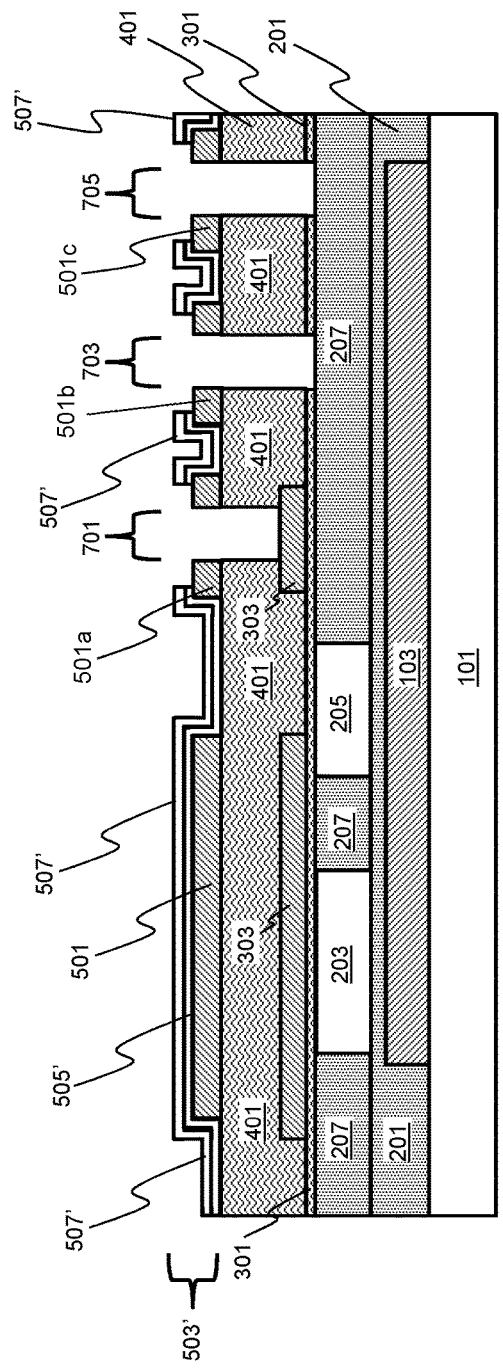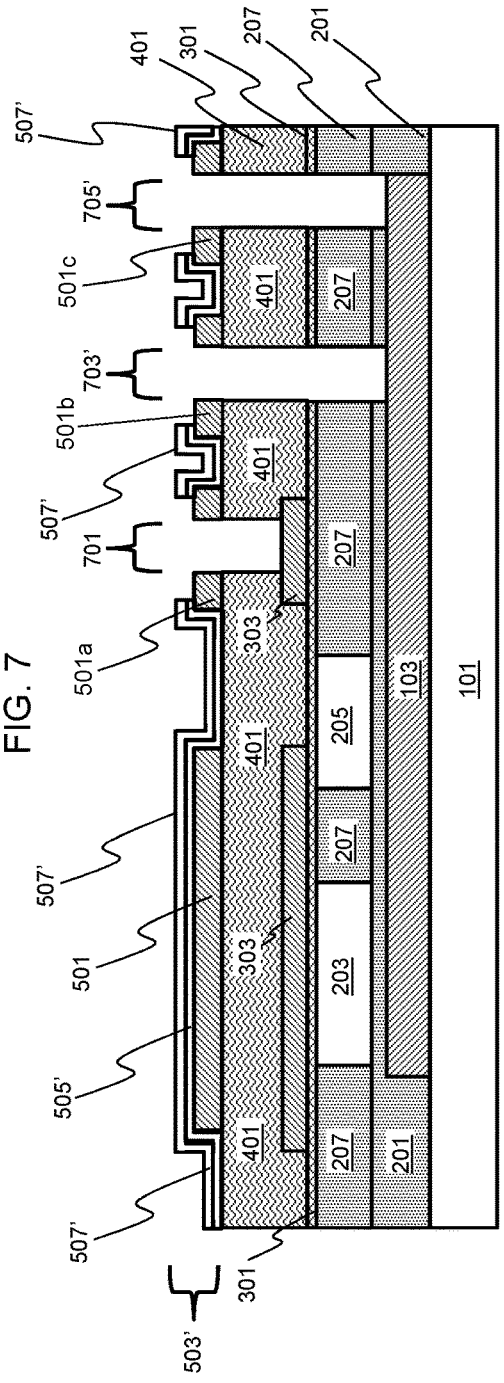

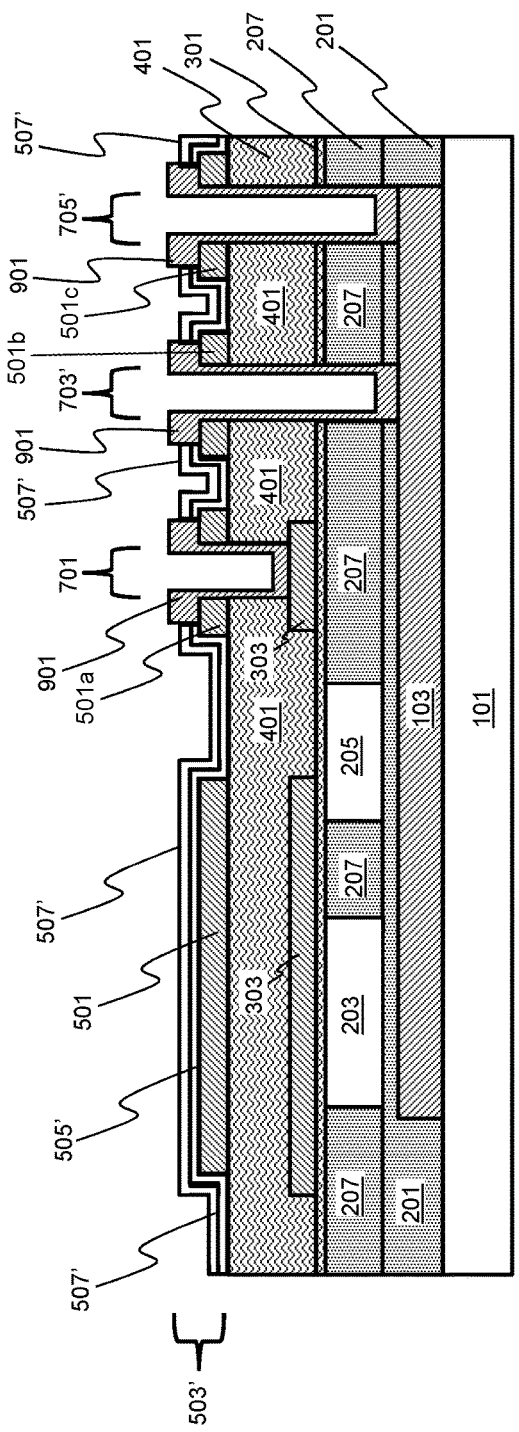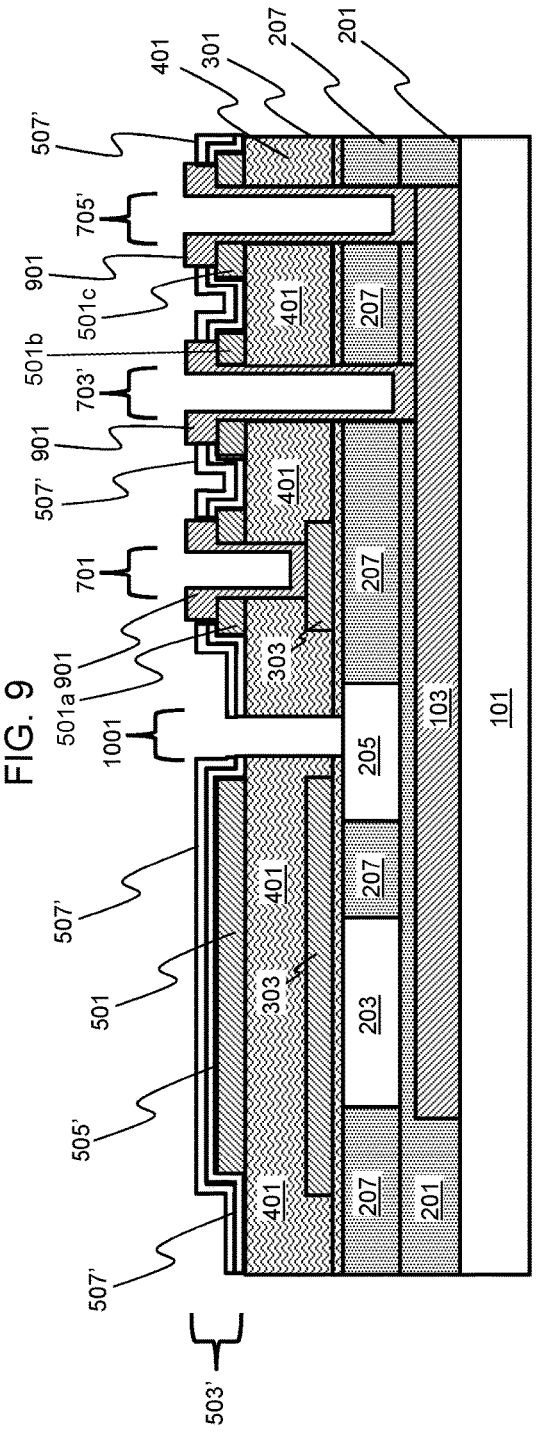
FIG. 9
FIG. 10

METHOD FOR PRODUCING MONOLITHIC INTEGRATION OF PIEZOELECTRIC MICROMACHINED ULTRASONIC TRANSDUCERS AND CMOS

CROSS REFERENCE TO RELATED APPLICATIONS

This application is a Divisional of application Ser. No. 15/840,881 filed Dec. 13, 2017, and included herein by reference.

BACKGROUND OF THE INVENTION

1. Field of the Invention

The present disclosure relates to semiconductor fabrication. In particular, the present disclosure relates to the formation of micro-electro-mechanical systems (MEMS) on a semiconductor wafer.

2. Description of the Prior Art

A piezoelectric micromachined ultrasonic transducer (PMUT) may be used in nondestructive testing, medical imaging, fingerprint scanning, and the like. Fingerprint mobile applications need high frequency PMUT (HF PMUT). HF MPUT needs precise control of phase signal loss. Current developments in this area have focused on wafer bonding, which introduces additional cost, bonding yield, and complex interconnect design factors into the fabrication process. Known monolithic HF PMUT plus integrated circuit (IC) devices have complex process flows for forming the required elastic, sealing, and passivation layers.

A need therefore exists for methodology for forming a monolithic integrated PMUT and CMOS using a relatively simpler and reduced-cost flow, and the resulting device.

SUMMARY OF THE INVENTION

An aspect of the present disclosure is method of forming a monolithic integrated PMUT and CMOS with a coplanar elastic, sealing, and passivation layer formed in a single step without wafer bonding.

Another aspect of the present disclosure is a device including a monolithic PMUT and signal processing integrated circuit with a coplanar elastic, sealing, and passivation layer.

A further aspect of the present disclosure is a device including a monolithic stand-alone PMUT with a coplanar elastic, sealing, and passivation layer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a CMOS wafer with a metal layer; forming a dielectric layer over the CMOS wafer; forming a sacrificial structure in a portion of the dielectric layer over the metal layer; forming a bottom electrode over portions of the sacrificial layer and the dielectric layer; forming a piezoelectric layer over the CMOS wafer; forming a top electrode over portions of the bottom electrode and the piezoelectric layer; forming a first via through a first portion of the top electrode down to a portion of the bottom electrode laterally separated from the sacrificial structure and a second via down to the metal layer through a second portion of the top electrode proximate to the first portion; forming a second metal layer over and along sidewalls of the first via and the second via and over a portion of the first portion and the second portion of the top electrode; removing the sacrificial structure, an open cavity formed; and forming a second dielectric layer over a portion of the CMOS wafer, the open cavity sealed and an elastic layer and passivation formed.

Aspects of the present disclosure include forming the dielectric layer and the sacrificial structure by: forming a first dielectric layer over the CMOS wafer; forming a sacrificial layer over the first dielectric layer; patterning the sacrificial layer, the sacrificial structure formed; forming a third dielectric layer over the CMOS wafer; and planarizing the third dielectric layer down to the sacrificial structure, wherein the first dielectric layer and the third dielectric layer comprise the dielectric layer. Other aspects include forming the dielectric layer and the sacrificial structure by: forming the dielectric layer over the CMOS wafer; removing a portion of the dielectric layer down to the metal layer, a trench formed; forming a sacrificial layer over the CMOS wafer, filling the trench entirely; and planarizing the sacrificial layer down to the dielectric layer, the sacrificial structure formed. Further aspects include forming the bottom electrode by: forming a seeding layer over the CMOS wafer; forming a third metal layer over the seeding layer; and patterning the third metal layer. Other aspects include forming the bottom electrode by: forming a third metal layer over respective portions of the dielectric layer and the sacrificial structure; and patterning the third metal layer. Another aspect includes forming the top electrode by: forming a fourth metal layer over the piezoelectric layer; and patterning the fourth metal layer. Other aspects include forming a protection layer over the CMOS wafer and along sidewalls of the top electrode; and removing a portion of the protection layer down to the top electrode prior to forming the first via and the second via, wherein the second metal layer is formed along sidewalls of the protection layer adjacent to the first via and the second via. Further aspects include removing the sacrificial structure by: forming a release via through the protection layer and the piezoelectric layer down to the sacrificial structure; and performing a dry or wet release etch process. Another aspect includes forming a third via through a third portion of the top electrode down to the metal layer, the third portion on an opposite side of the second portion from the first portion; removing the portion of the protection layer prior to forming the third via; forming the second metal layer over and along sidewalls of the third via and along sidewalls of the protection layer adjacent to the third via; forming a fourth dielectric layer over a remaining portion of the CMOS wafer; and forming a trench over the third via through the third dielectric layer down to the second metal layer, an opened pad formed, wherein the second via and the third via are formed as PMUT-application specific integrated circuit (ASIC) electrode vias.

Additional aspects include providing the CMOS wafer with a metal through silicon via (TSV), the metal TSV laterally separated from the metal layer and remote from the cavity; forming a third via over the metal TSV through a third portion of the top electrode down to the metal TSV; removing the portion of the protection layer prior to forming the third via; forming the second metal layer over and along sidewalls of the third via and along sidewalls of the protection layer adjacent to the third via; forming an under bump metallization (UBM) layer under the metal TSV and a portion of the CMOS wafer; forming a fourth dielectric layer over a remaining portion of the CMOS wafer; and forming a coupling layer over the second dielectric layer and the fourth dielectric layer. Other aspects include forming a third metal layer over a third portion of the top electrode, the third portion on an opposite side of the second portion from the first portion; forming a fourth dielectric layer over a remaining portion of the CMOS wafer; forming a trench through the fourth dielectric layer down to the third metal layer; forming a TSV through the CMOS wafer, the dielectric layer, the piezoelectric layer, and the third portion of the top electrode; forming an UBM layer under the metal TSV and a portion of the CMOS wafer; and forming a coupling layer over the second dielectric layer and the fourth dielectric layer.

Another aspect of the present disclosure is a device including: a metal layer over a portion of a CMOS wafer; a first dielectric layer over a portion of the CMOS wafer; a cavity in a portion of the first dielectric layer over the metal layer; a bottom electrode over respective portions of the first dielectric layer and the cavity; a piezoelectric layer over a portion of the cavity and the CMOS wafer, a gap formed over a remaining portion of the cavity; a top electrode over a portion of the piezoelectric layer; a protection layer over the piezoelectric layer and a portion of the top electrode and along sidewalls of the top electrode; a first via through the piezoelectric layer and a first portion of the top electrode down to a portion of the bottom electrode laterally separated from the cavity; a second via through the piezoelectric layer, the dielectric layer, and a second portion of the top electrode proximate to the first portion down to the metal layer; a second metal layer over and along sidewalls of the first via and the second via, over portions of the first portion of the top electrode and the second portion of the top electrode, and along sidewalls of the protection layer adjacent to the first via and the second via; and a second dielectric layer over a portion of the CMOS wafer, the cavity, an elastic layer, and passivation formed.

Aspects of the device include a seeding layer over a portion of the cavity and the CMOS wafer, the seeding layer formed over the respective portions of the first dielectric layer and the cavity and under the bottom electrode and the piezoelectric layer. Additional aspects include a third dielectric layer over a remaining portion of the CMOS wafer. Other aspects include a third via through the piezoelectric layer, the first dielectric layer, and a third portion of the top electrode, down to the metal layer, the third via on an opposite side of the second via from the first via; the second metal layer over and along sidewalls of the third via, over portions of the third portion of the top electrode, and along sidewalls of the protection layer adjacent to the third via; and a third dielectric layer over a portion of the CMOS wafer laterally separated from the second dielectric layer, an open pad formed, wherein the second via and the third via comprise PMUT-ASIC electrode vias. Additional aspects include a metal TSV through the CMOS wafer, the metal TSV laterally separated from the metal layer; a third via through the piezoelectric layer, the first dielectric layer, and a third portion of the top electrode down to the metal TSV, the third via on an opposite side of the second via from the first via; the second metal layer over and along sidewalls of the third via, over portions of the third portion of the top electrode, and along sidewalls of the protection layer adjacent to the third via; a third dielectric layer over a remaining portion of the CMOS wafer; an UBM layer under the metal TSV and a portion of the CMOS wafer; and a coupling layer over the second dielectric layer and the third dielectric layer. Another aspect includes a third dielectric layer over a portion of the CMOS wafer laterally separated from the second dielectric layer; a metal TSV through the CMOS wafer, the first dielectric layer, the piezoelectric layer, and a third portion of the top electrode, respective portions of the second dielectric layer and the third dielectric layer, the third portion on an opposite side of the second portion from the first portion of the top electrode; an UBM layer the metal TSV and a portion of the CMOS wafer; and a coupling layer over the second dielectric layer and the third dielectric layer.

A further aspect of the present disclosure is a device including: a cavity in a portion of a first dielectric layer over a silicon (Si) wafer; a bottom electrode over respective portions of the first dielectric layer and the cavity; a piezoelectric layer over a portion of the cavity and the Si wafer, a gap formed over a remaining portion of the cavity; a top electrode over a portion of the piezoelectric layer; a protection layer over the piezoelectric layer and a portion of the top electrode and along sidewalls of the top electrode; a via through the piezoelectric layer and a portion of the top electrode down to a portion of the bottom electrode laterally separated from the cavity; a metal layer over and along sidewalls of the via, over a portion of the portion of the top electrode, and along sidewalls of the protection layer adjacent to the via; and a second dielectric layer with a first portion and a second portion laterally separated over the Si wafer, cavity, an elastic layer, and passivation formed.

Aspects of the device include a second metal layer over a portion of the Si wafer and under the cavity and a portion of the first dielectric layer, a second via through the piezoelectric layer and the first dielectric layer, a second portion of the top electrode proximate to the portion of the top electrode down to the second metal layer; a third via through the piezoelectric layer, the first dielectric layer, and a third portion of the top electrode down to the second metal layer, the third via on an opposite side of the second via from the first via; and the metal layer over and along sidewalls of the second via and the third via, over respective portions of the second portion of the top electrode and the third portion of the top electrode, wherein the metal layer over the third portion of the top electrode comprises an open pad. Other aspects include a second metal layer over a second portion and a third portion of the top electrode proximate to the portion of the top electrode and along sidewalls of the protection layer, wherein the metal layer over the third portion of the top electrode comprises an open pad.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The present disclosure is illustrated by way of example, and not by way of limitation, in the figures of the accompanying drawing and in which like reference numeral refer to similar elements and in which:

FIGS. 1 through 12 schematically illustrate cross sectional views of a process flow for forming a monolithic integrated PMUT and CMOS with a coplanar elastic, sealing, and passivation layer formed in a single step without wafer bonding, in accordance with an exemplary embodiment;

DETAILED DESCRIPTION

Figure 1:
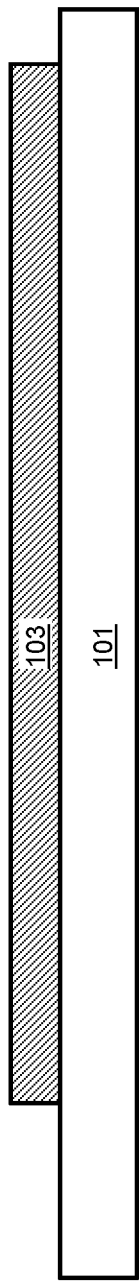

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about".

The present disclosure addresses and solves the current problems of additional costs, bonding yield factors such as phase shifting, signal loss, etc., and complex inter connect designs attendant upon known wafer bonding HF PMUT fabrication techniques and complex process flows attendant upon forming the requisite elastic, sealing, and passivation layers according to known monolithic HF-PMUT+IC fabrication techniques. The problems are solved, inter alia, by forming a monolithic integrated PMUT and CMOS with a coplanar elastic, sealing, and passivation layer formed in a single step without wafer bonding.

Methodology in accordance with embodiments of the present disclosure includes providing a CMOS wafer with a metal layer. A dielectric layer is formed over the CMOS wafer and a sacrificial structure is formed in a portion of the dielectric layer over the metal layer. A bottom electrode is formed over portions of the sacrificial structure and the dielectric layer and a piezoelectric layer is formed over the CMOS wafer. A top electrode is formed over portions of the bottom electrode and the piezoelectric layer. A first via is formed through a first portion of the top electrode down to a portion of the bottom electrode laterally separated from the sacrificial structure and a second via is formed down to the metal layer through a second portion of the top electrode proximate to the first portion. A second metal layer is formed over and along sidewalls of the first via and the second via and over a portion of the first portion and the second portion of the top electrode. The sacrificial structure is removed forming an open cavity and a second dielectric layer is formed over a portion of the CMOS wafer, sealing the open cavity and forming an elastic layer and passivation.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1 through 12 schematically illustrate cross-sectional views of a process flow for forming a monolithic integrated PMUT and CMOS with a coplanar elastic, sealing, and passivation layer formed in a single step without wafer bonding, in accordance with an exemplary embodiment. Referring to FIG. 1, a CMOS wafer 101 is provided with a (last) metal layer 103, e.g., formed of aluminum (Al) or copper (Cu).

Figure 2A:
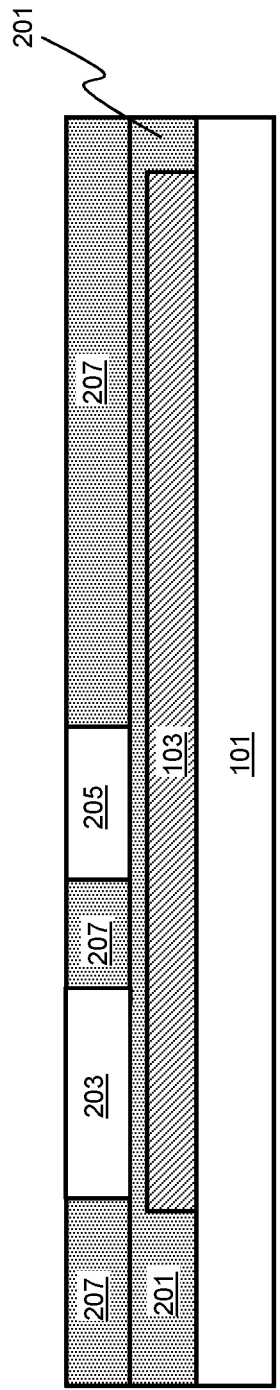

Next, a dielectric layer and sacrificial structures are formed using one of two possible process flows. In the first instance, a dielectric layer 201 is formed, e.g., of silicon dioxide ($SiO_2$), silicon nitride (SiN), aluminum nitride (AlN), aluminum oxide ($Al_2O_3$), other suitable dielectrics, or a combination of these materials, over the CMOS wafer 101 and then planarized, e.g., by chemical-mechanical polishing (CMP), as depicted in FIG. 2A. The resultant thickness of the dielectric layer 201 relative to the metal layer 103 may be from 0 micrometer ($\mu m$) (the metal layer 103 being exposed) to 5 $\mu m$, e.g., 1-2 $\mu m$. A sacrificial layer (not shown for illustrative convenience) is then formed, e.g., of amorphous silicon (a-Si), $SiO_2$, tungsten (W), molybdenum (Mo), or other suitable materials, over the dielectric layer 201 and patterned, forming the sacrificial structures 203 and 205. The dimensions and the distance between the sacrificial structures 203 and 205 are based on the final MEMS design, for example, 1 $\mu m$ to 1000 $\mu m$, e.g., 20 $\mu m$ to 100 $\mu m$ and 1 $\mu m$ to 50 $\mu m$, respectively. Thereafter, a dielectric layer 207 is formed over the CMOS wafer 101 and planarized, e.g., by CMP, down to the sacrificial structures 203 and 205.

Figure 2B:
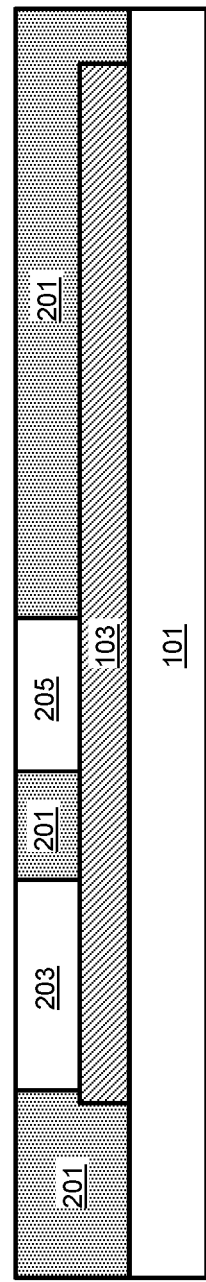

Alternatively, a dielectric layer 201 is formed over the CMOS wafer 101, planarized, e.g., by CMP, and then patterned (not shown for illustrative convenience). Thereafter, a sacrificial layer (not shown for illustrative convenience) is formed over the dielectric layer 201 and planarized, e.g., by CMP, down to the dielectric layer 201, forming the sacrificial structures 203 and 205, as depicted in FIG. 2B.

Referring to FIG. 3, an optional seeding layer 301 is formed, e.g., of AlN, over the CMOS wafer 101 and a metal layer (not shown for illustrative convenience) is formed, e.g., of Mo, W, Al, platinum (Pt), or other suitable material, over the seeding layer 301. The metal layer is then patterned to form the bottom electrode 303. In this instance, FIGS. 3 through 20 are illustrated only following FIG. 2A for the purposes of simplicity; however, it should be under stood that the same process steps also follow FIG. 2B. A piezoelectric layer 401 is then formed, e.g., of AlN, lead zirconate titanate (PZT), or polyvinylidene flouride (PVDF) over the CMOS wafer 101 and the type of material used to form the piezoelectric layer 401 often dictates the type of material that can be used for forming the optional seeding layer 301. In this instance, both the optional seeding layer 301 and the piezoelectric layer 401 are formed of AlN.

Figure 5:
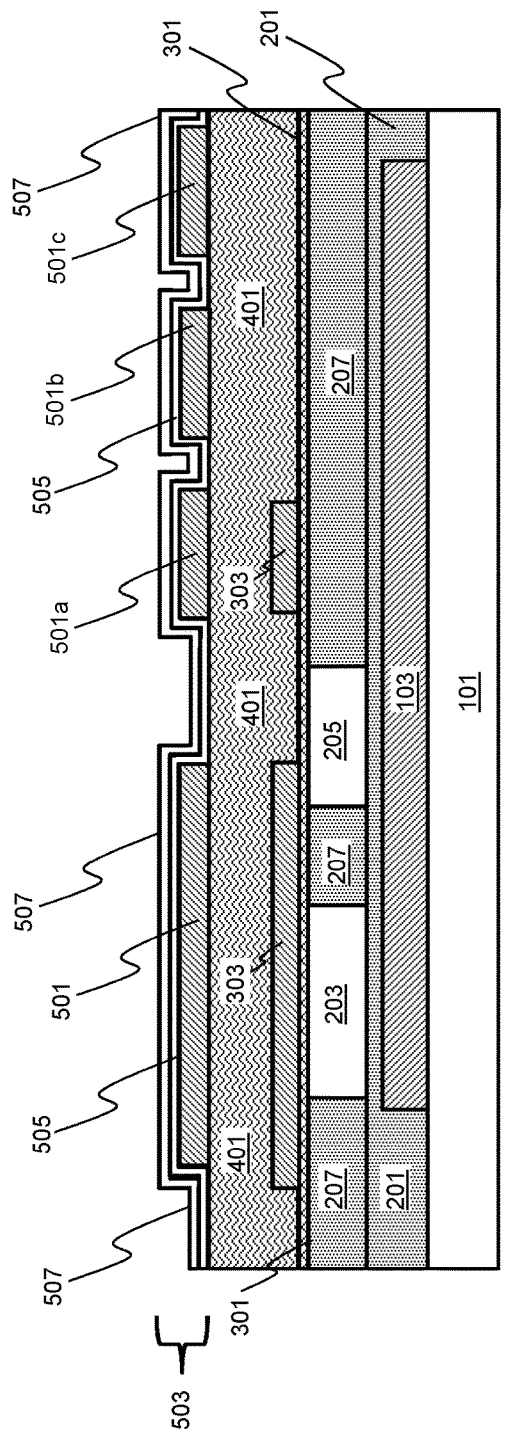

Next, a metal layer (not shown for illustrative convenience) is formed over the piezoelectric layer 401 and then patterned, forming a top electrode including a main portion of the top electrode 501, a first portion of the top electrode 501*a*, a second portion of the top electrode 501*b* and a third portion of the top electrode 501*c* over the bottom electrode 303 and the piezoelectric layer 401, as depicted in FIG. 5. As with the bottom electrode 303, the top electrode 501 may be formed, e.g., of Mo, W, Al, Pt, or other suitable material. A protection layer 503 is then formed, e.g., of an AlN or $Al_2O_3$, layer 505 and an oxide layer 507, over the CMOS wafer 101 and along the sidewalls of the main portion of the top electrode 501, the first portion of the top electrode 501*a*, the second portion of the top electrode 501*b* and the third portion of the top electrode 501*c*.

Figure 6:
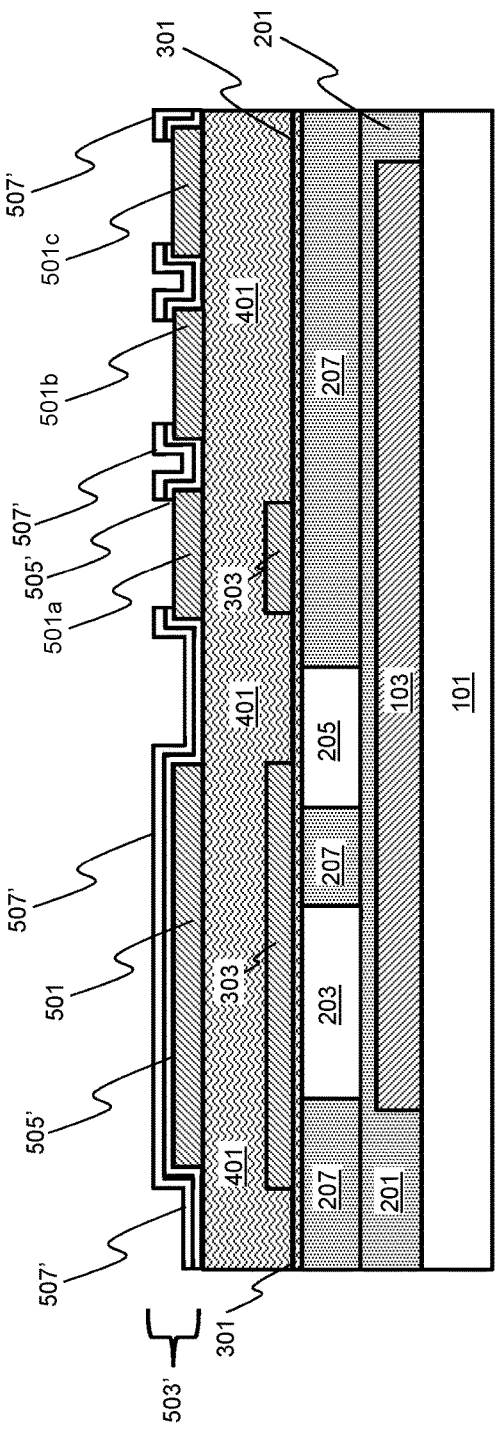

Referring to FIG. 6, portions of the protection layer 503 are removed down to the first portion of the top electrode 501*a*, the second portion of the top electrode 501*b* and the third portion of the top electrode 501*c* for subsequent via formation, forming the protection layer 503', AlN or Al2O3 layer 505', and oxide layer 507'. Next, bottom electrode vias 701, 703, and 705 are formed in between the openings of the protection layer 503' through the first portion of the top electrode 501*a*, the second portion of the top electrode 501*b* and the third portion of the top electrode 501*c* down to the bottom electrode 303 and the dielectric layer 207, respectively, as depicted in FIG. 7. The vias 703 and 705 are then extended down to the metal layer 103, forming PMUT-ASIC vias 703' and 705', as depicted in FIG. 8.

Figure 11:
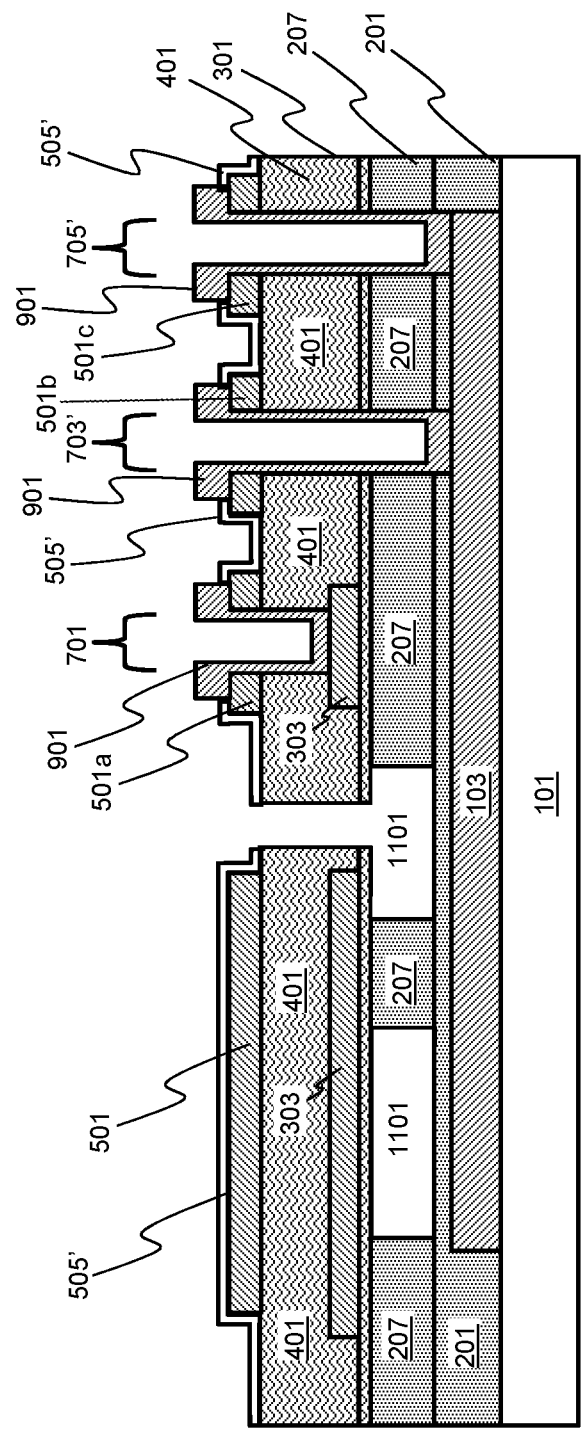

A metal layer 901 is then formed, e.g., of Al, over and along sidewalls of the vias 701, 703', and 705' and over portions of the first portion of the top electrode 501*a*, the second portion of the top electrode 501*b* and the third portion of the top electrode 501*c* adjacent to the vias 701, 703', and 705', as depicted in FIG. 9. Referring to FIG. 10, a release via 1001 is formed through the protection layer 503' and the piezoelectric layer 401 down to the sacrificial structures 205 and 203 (not shown for illustrative convenience). Thereafter, a dry or wet release etch process is performed to remove the sacrificial structures 203 and 205, forming open cavities 1101, as depicted in FIG. 11. In addition, the oxide layer 507' is also removed as a result of the dry or wet release etch process.

Figure 12:
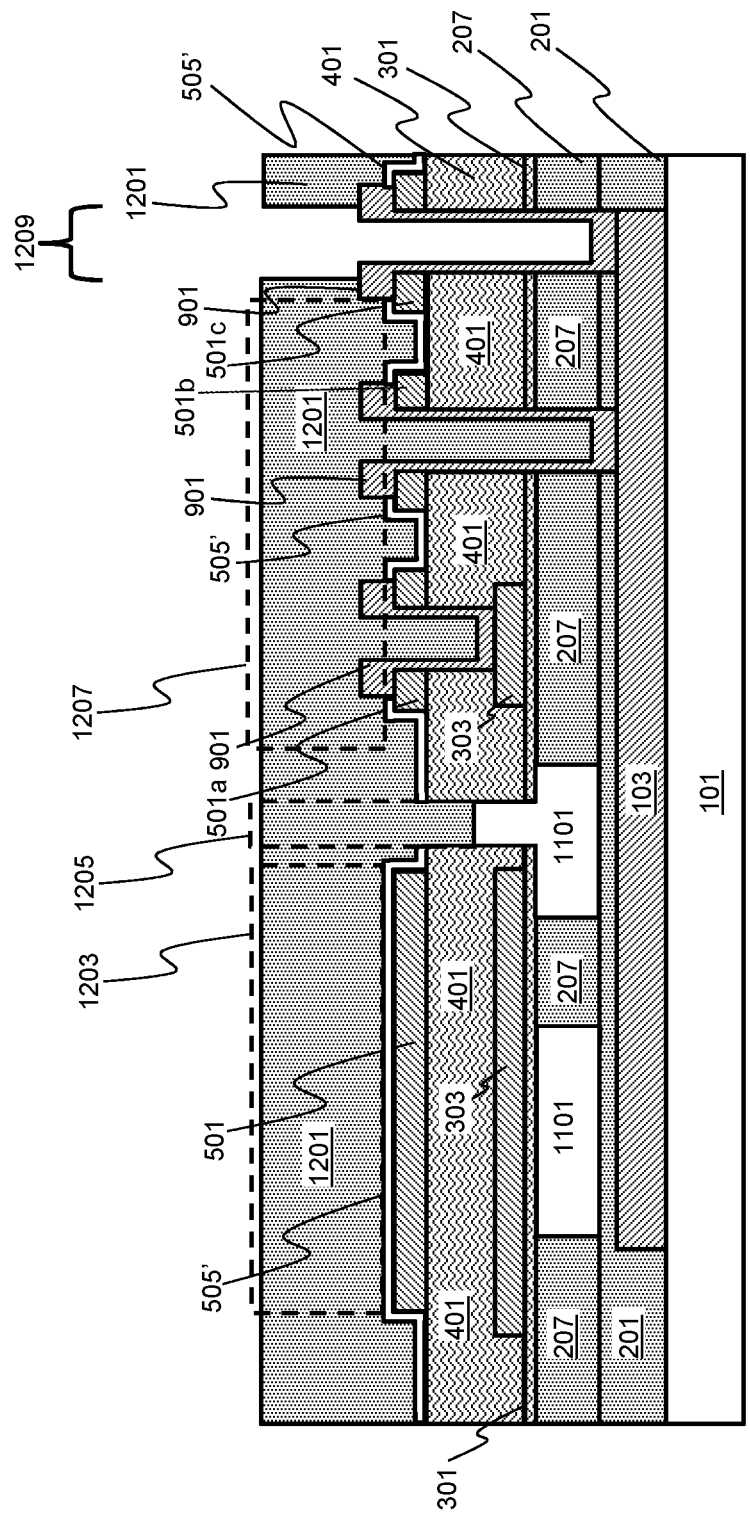

Referring to FIG. 12, a dielectric layer 1201 is formed, e.g., by chemical vapor deposition (CVD) or plasma vapor deposition (PVD), over the CMOS wafer 101, thereby sealing the open cavities 1101 and forming an elastic layer and passivation as highlighted by the boxes 1203, 1205, and 1207, respectively. The dielectric layer 1201 may be formed, e.g., of $SiO_2$, SiN, AlN, $Al_2O_3$, other suitable dielectrics, or a combination of these materials. Thereafter, a trench 1209 may be formed through the dielectric layer 1201, reopening the via 705' of FIG. 8, thereby forming an open pad for subsequent packaging/external interconnects, e.g., wire bonding, (not shown for illustrative convenience).

Figure 13:
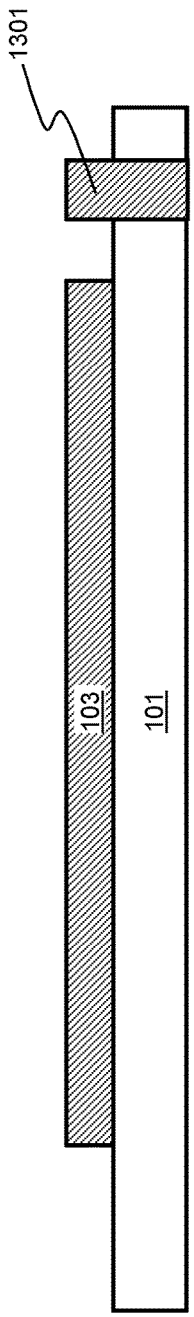
FIGS. 13 through 15 schematically illustrate cross sectional views of a partial process flow for forming a monolithic integrated PMUT and CMOS with a TSV and with a coplanar elastic, sealing, and passivation layer formed in a single step without wafer bonding, in accordance with an exemplary embodiment.
Figure 14:
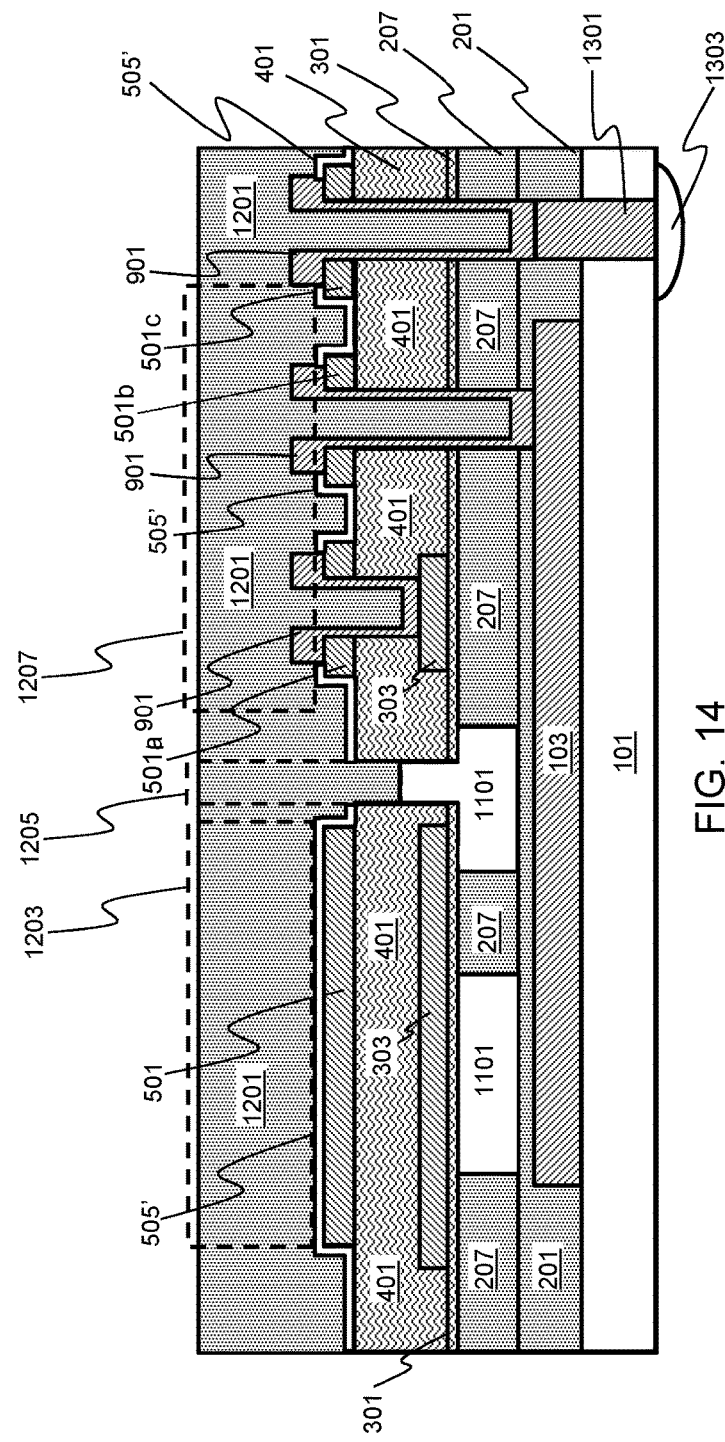
Figure 15:
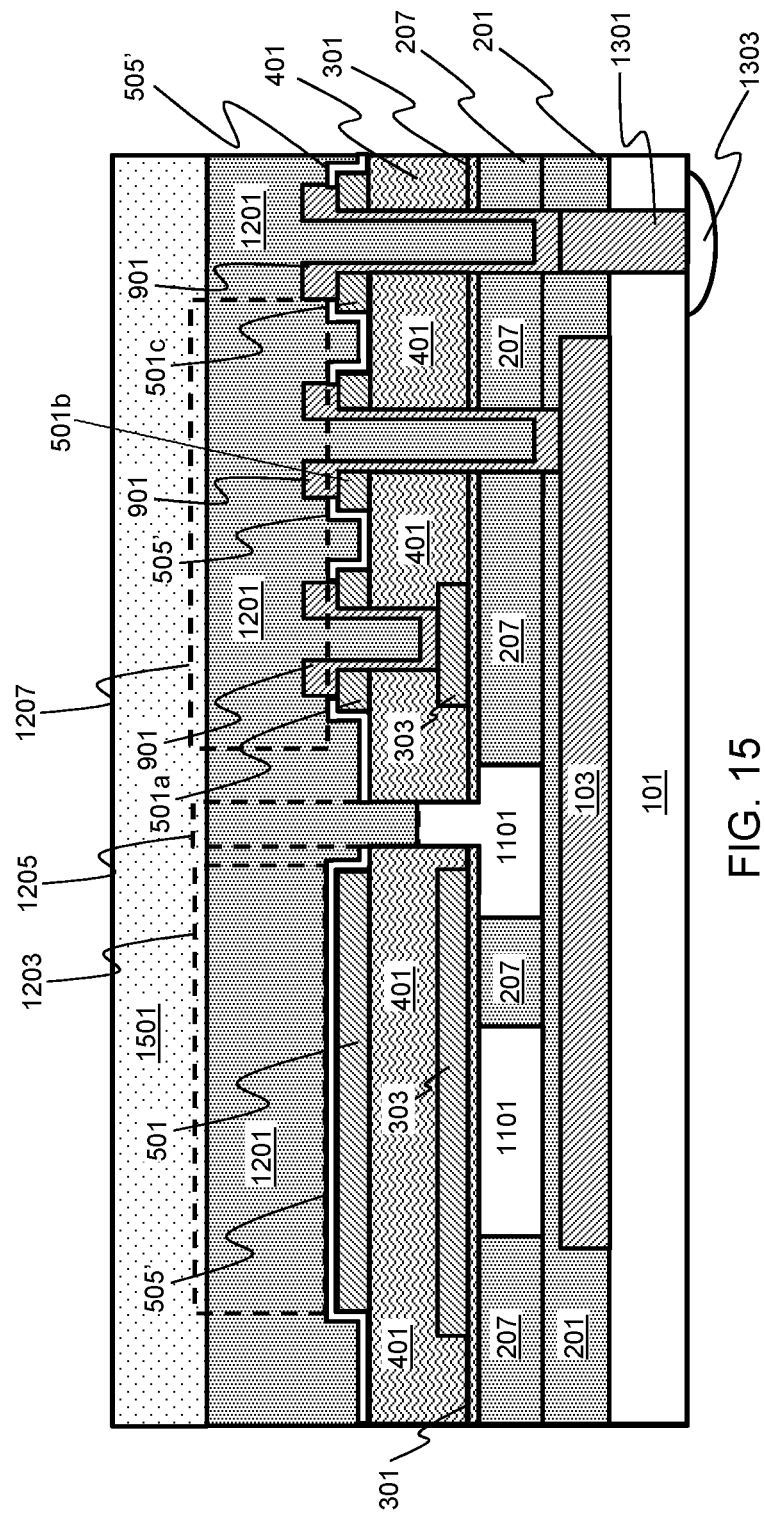

FIGS. 13 through 15 schematically illustrate cross-sectional views of a partial process flow for forming a monolithic integrated PMUT and CMOS with a TSV and with a coplanar elastic, sealing, and passivation layer formed in a single step without wafer bonding, in accordance with an exemplary embodiment. Referring to FIG. 13, the CMOS wafer 101 of FIG. 1 is again provided with a (last) metal layer 103, e.g., formed of Al or Cu; however, in this instance, the CMOS wafer 101 is also provided with a TSV 1301 formed, e.g., of Al or Cu, laterally separated from the metal layer 103. The process steps of FIGS. 2 through 12 are then largely repeated, as depicted in the resultant device of FIG. 14, except that in this instance, the via 705' of FIG. 8 is extended down to the TSV 1301 instead of the metal layer 103, the trench 1209 is not formed in the dielectric layer 1201, and a UMB 1303 is formed under the TSV 1301 and a portion of the CMOS wafer 101. Referring to FIG. 15, a coupling layer 1501 may be formed, e.g., of polymer, over the dielectric layer 1201 so that the device may be subsequently attached to other surfaces, e.g., glass, (not shown for illustrative convenience).

Figure 16:
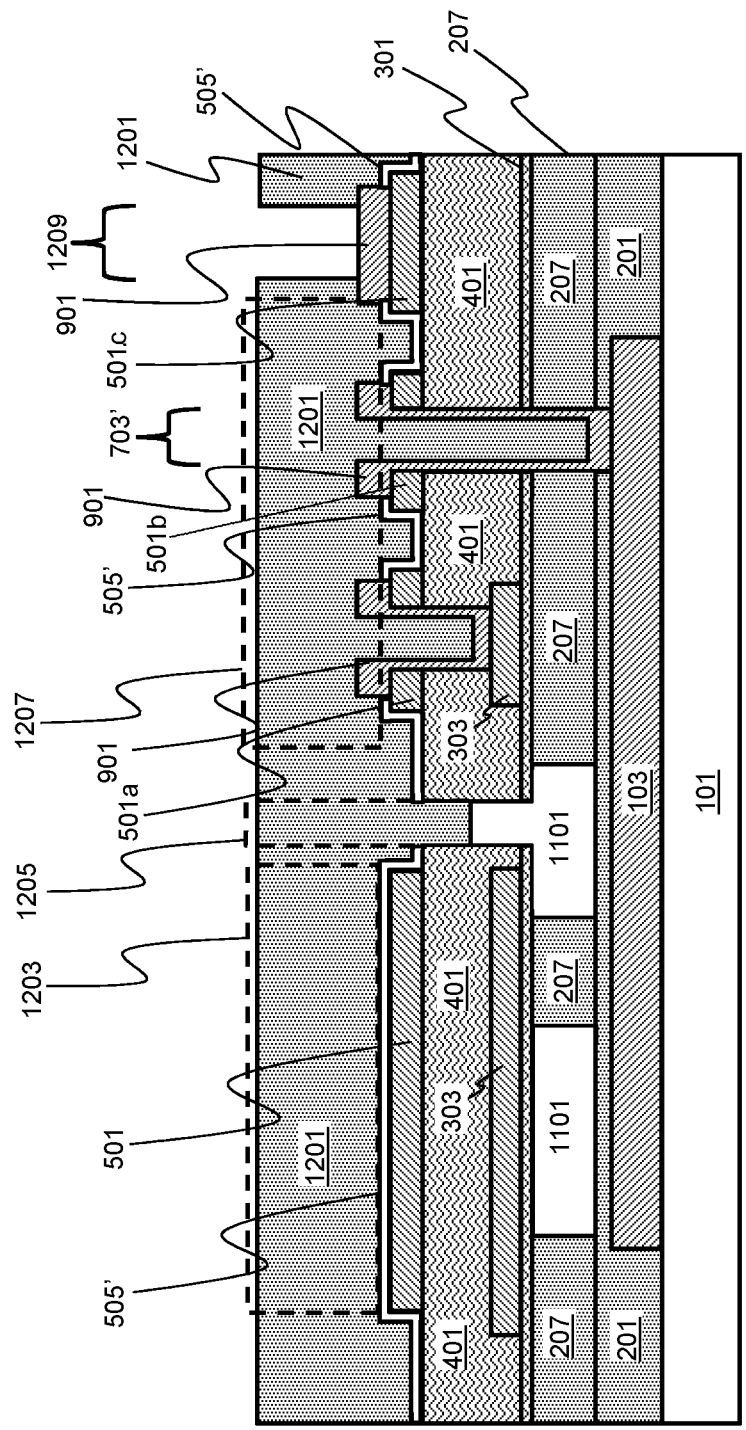
FIGS. 16 through 18 schematically illustrate cross sectional views of a partial process flow for forming a monolithic integrated PMUT and CMOS with a TSV and with a coplanar elastic, sealing, and passivation layer formed in a single step without wafer bonding, in accordance with another exemplary embodiment.
Figure 17:
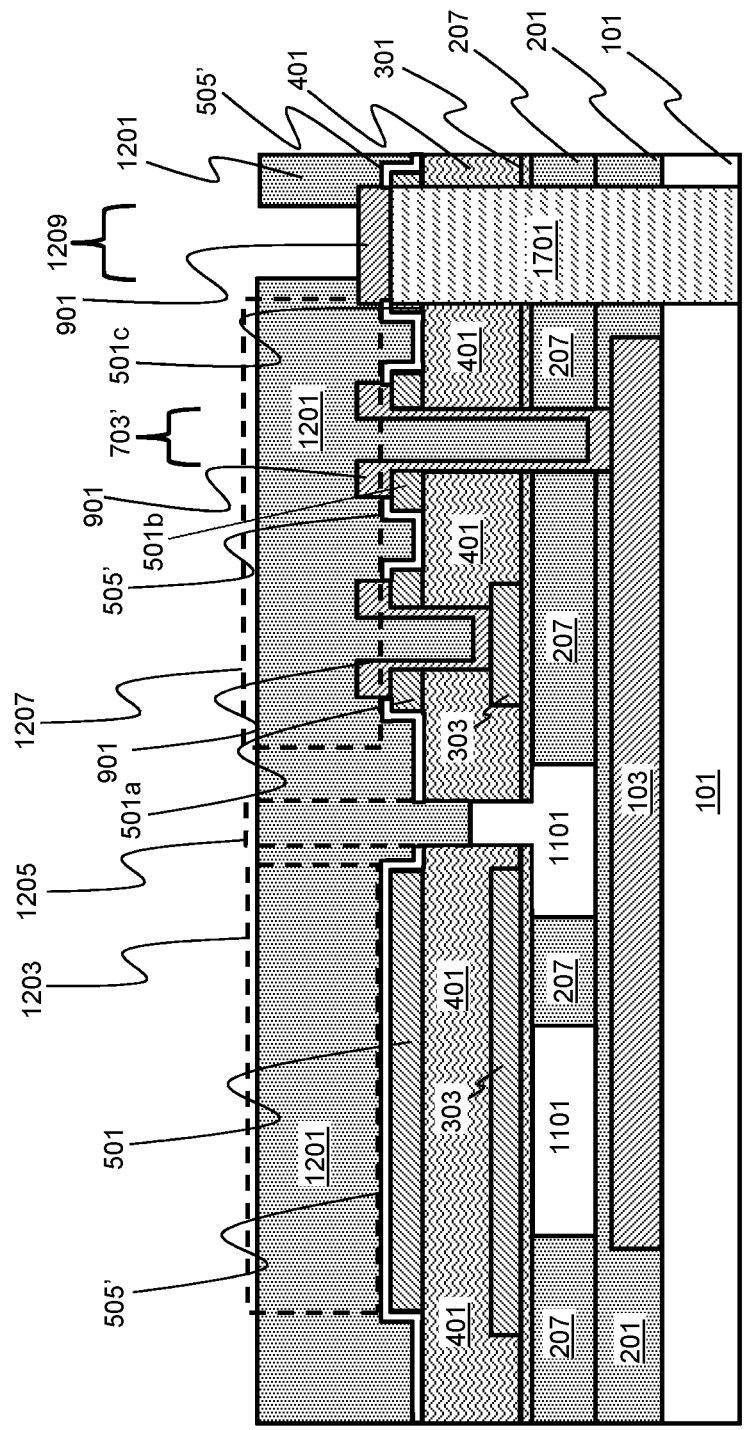
Figure 18:
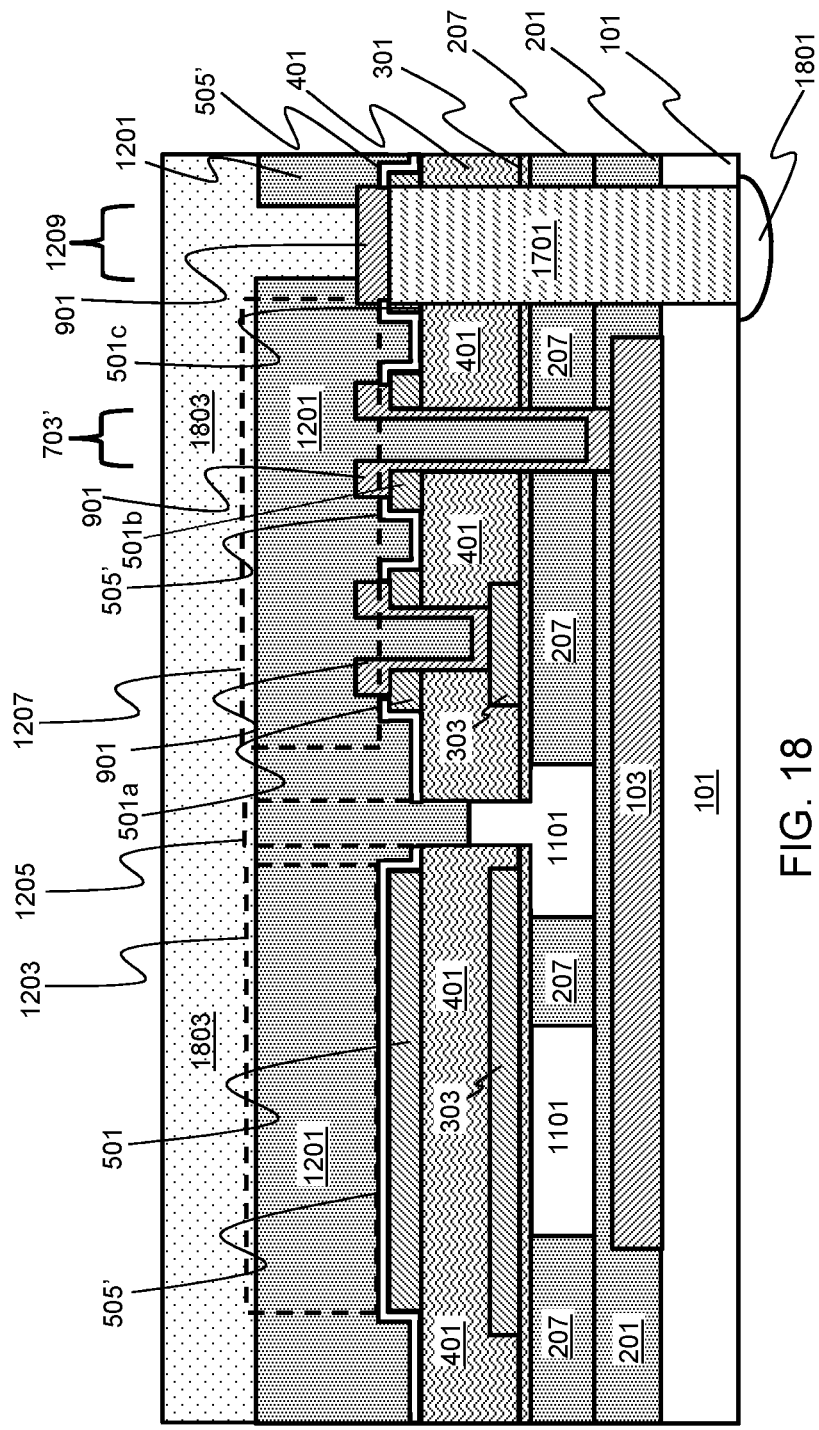

FIGS. 16 through 18 schematically illustrate cross sectional views of a partial process flow for forming a monolithic integrated PMUT and CMOS with a TSV and a coplanar elastic, sealing, and passivation layer formed in a single step without wafer bonding, in accordance with another exemplary embodiment. Referring to FIG. 16, the CMOS wafer 101 of FIG. 1 is again provided with a (last) metal layer 103, e.g., formed of Al or Cu, and the process steps of FIGS. 2 through 12 are again largely repeated; however, in this instance, rather than forming the metal layer 901 over and along the sidewalls of the via 705', the metal layer 901 is formed over the second portion of the top electrode 501*b* and the third portion of the top electrode 501*c* adjacent to the via 703' and the trench 1209 is formed through the dielectric layer 1201 over the metal layer 901. Referring to FIG. 17, a TSV 1701 is then formed through the CMOS wafer 101, the dielectric layers 201 and 207, the optional seeding layer 301, the piezoelectric layer 401, and the third portion of the top electrode 501*c* up to the metal layer 901. Thereafter, a UMB 1801 is formed under the TSV 1701 and a portion of the CMOS wafer 101 and a coupling layer 1803 may be formed, e.g., of polymer, over the dielectric layer 1201, filling the trench 1209, as depicted in FIG. 18.

Figure 19:
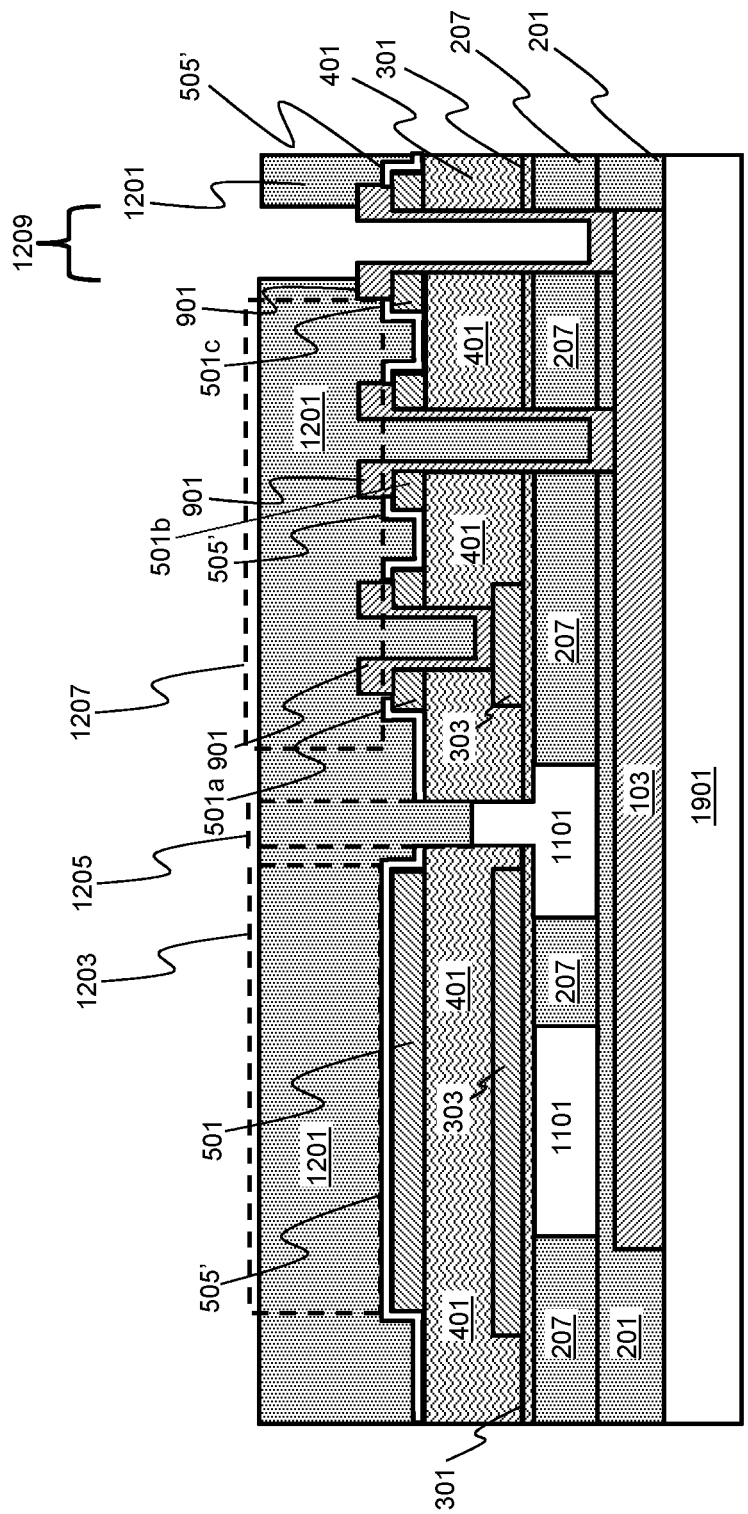
FIGS. 19 and 20 schematically illustrate cross sectional views of a resultant monolithic stand-alone PMUT with a coplanar elastic, sealing, and passivation layer formed in a single step without wafer bonding, in accordance with an exemplary embodiment.
Figure 20:
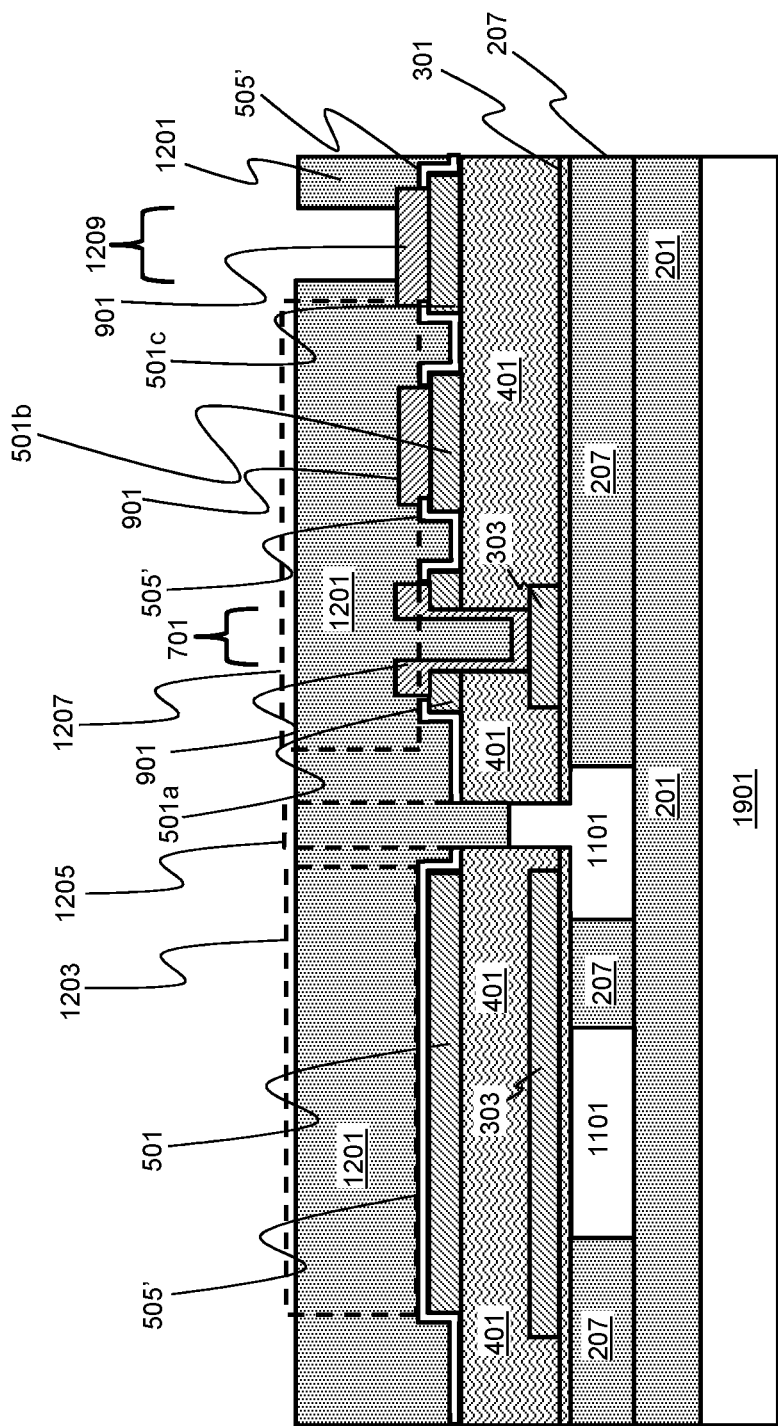

FIGS. 19 and 20 schematically illustrate cross sectional views of a resultant monolithic stand-alone PMUT with a coplanar elastic, sealing, and passivation layer formed in a single step without wafer bonding, in accordance with an exemplary embodiment. The process flow for forming the resultant device of FIG. 19 is almost identical to the process flow of FIGS. 1 through 12, except that in this instance, the metal layer 103 is formed over a Si wafer 1901 instead of the CMOS wafer 101. Similarly, the process flow for forming the resultant device of FIG. 20 is almost identical to the process flow of FIGS. 1 through 16; however, in this instance, the dielectric layer 201 is formed over a Si wafer 2001 without a metal layer, and rather than forming the metal layer 901 over and along the sidewalls of the vias 703' and 705' of FIG. 8, the metal layer 901 is formed over the second portion of the top electrode 501*b* and the third portion of the top electrode 501*c* adjacent to the via 701.

The embodiments of the present disclosure can achieve several technical effects such as removing potential application concerns commonly associated with the bonding integration process, e.g., phase shifting, signal loss, etc., due to the monolithic integration of PMUT and CMOS and providing a simpler and reduced-cost flow relative to known HF PMUT and HF-PMUT+IC process flows due to sealing the cavity and forming the elastic layer and passivation in the same step without wafer bonding. In addition, the distance between the cavities may be reduced relative to known devices, e.g., >10 µm to approximately 1 µm, because there is no need for bonding stand-off. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of semiconductor devices including PMUT and CMOS and stand-alone PMUT.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for producing monolithic integration of a piezoelectric micromachined ultrasonic transducer (PMUT) and a complementary metal oxide semiconductor (CMOS); the method comprising:
   providing a complimentary metal-oxide-semiconductor (CMOS) wafer with a metal layer;
   forming a dielectric layer over the CMOS wafer with the metal layer;
   forming a sacrificial structure in a portion of the dielectric layer over the metal layer;
   forming a bottom electrode over portions of the sacrificial structure and the dielectric layer;
   forming a piezoelectric layer over the CMOS wafer with the bottom electrode;
   forming a top electrode over portions of the bottom electrode and the piezoelectric layer;
   forming a protection layer over the CMOS wafer and along sidewalls of the top electrode;
   removing a portion of the protection layer down to the top electrode;
   forming a first via through a first portion of the top electrode down to a portion of the bottom electrode laterally separated from the sacrificial structure and a second via down to the metal layer through a second portion of the top electrode proximate to the first portion;
   forming a second metal layer over and along sidewalls of the first via and the second via, over a portion of the first portion and the second portion of the top electrode, and along sidewalls of the protection layer adjacent to the first via and the second via;
   removing the sacrificial structure, an open cavity formed; and
   forming a second dielectric layer over the CMOS wafer with the open cavity, the second dielectric layer comprising a first portion sealing the open cavity, a second portion serving as an elastic layer of the piezoelectric micromachined ultrasonic transducer (PMUT), and a third portion functioning for passivation of the complementary metal oxide semiconductor (CMOS).

2. The method according to claim 1, comprising forming the dielectric layer and the sacrificial structure by:
   forming a first dielectric layer over the CMOS wafer;
   forming a sacrificial layer over the first dielectric layer;
   patterning the sacrificial layer, the sacrificial structure formed;
   forming a third dielectric layer over the CMOS wafer; and
   planarizing the third dielectric layer down to the sacrificial structure,
   wherein the first dielectric layer and the third dielectric layer constitute the dielectric layer.

3. The method according to claim 1, comprising forming the dielectric layer and the sacrificial structure by:
   forming the dielectric layer over the CMOS wafer;
   removing a portion of the dielectric layer down to the metal layer, a trench formed;
   forming a sacrificial layer over the CMOS wafer, filling the trench entirely; and
   planarizing the sacrificial layer down to the dielectric layer, the sacrificial structure formed.

4. The method according to claim 1, further comprising forming the bottom electrode by:
   forming a seeding layer over the CMOS wafer;
   forming a third metal layer over the seeding layer; and
   patterning the third metal layer.

5. The method according to claim 1, further comprising forming the bottom electrode by:
   forming a third metal layer over respective portions of the dielectric layer and the sacrificial structure; and
   patterning the third metal layer.

6. The method according to claim 1, further comprising forming the top electrode by:
   forming a fourth metal layer over the piezoelectric layer; and
   patterning the fourth metal layer.

7. The method according to claim 1, further comprising removing the sacrificial structure by:
   forming a release via through the protection layer and the piezoelectric layer down to the sacrificial structure; and
   performing a dry or wet release etch process.

8. The method according to claim 1, further comprising:
   forming a third via through a third portion of the top electrode down to the metal layer, the third portion on an opposite side of the second portion from the first portion;
   removing the portion of the protection layer prior to forming the third via;
   forming the second metal layer over and along sidewalls of the third via and along sidewalls of the protection layer adjacent to the third via;
   forming a fourth dielectric layer over a remaining portion of the CMOS wafer; and forming a trench over the third via through the third dielectric layer down to the second metal layer,
   wherein the second via and the third via are formed as piezoelectric micromachined ultrasonic transducer (PMUT)-application specific integrated circuit (ASIC) electrode vias.

9. The method according to claim 1, further comprising:
   providing the CMOS wafer with a metal through silicon via (TSV), the metal TSV laterally separated from the metal layer and remote from the cavity;
   forming a third via over the metal TSV through a third portion of the top electrode down to the metal TSV;
   removing the portion of the protection layer prior to forming the third via;
   forming the second metal layer over and along sidewalls of the third via and along sidewalls of the protection layer adjacent to the third via;
   forming an under bump metallization (UBM) layer under the metal TSV and a portion of the CMOS wafer;

forming a fourth dielectric layer over a remaining portion of the CMOS wafer; and forming a coupling layer over the second dielectric layer and the fourth dielectric layer.

10. The method according to claim 1, further comprising:

forming a third metal layer over a third portion of the top electrode, the third portion on an opposite side of the second portion from the first portion;

forming a fourth dielectric layer over a remaining portion of the CMOS wafer;

forming a trench through the fourth dielectric layer down to the third metal layer;

forming a TSV through the CMOS wafer, the dielectric layer, the piezoelectric layer, and the third portion of the top electrode;

forming an UBM layer under the metal TSV and a portion of the CMOS wafer; and forming a coupling layer over the second dielectric layer and the fourth dielectric layer.

\* \* \* \* \*